(12) United States Patent
Lee (10) Patent No.: US 7,633,767 B2
(45) Date of Patent: Dec. 15, 2009

(54) MEMORY MODULES INCLUDING SIMM AND DIMM-TYPE CONNECTION STRUCTURES AND RELATED MEMORY SYSTEMS

(75) Inventor: Kee-hoon Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 575 days.

(21) Appl. No.: 11/432,131

(22) Filed: May 11, 2006

(65) Prior Publication Data

US 2006/0255445 A1 Nov. 16, 2006

(30) Foreign Application Priority Data

May 12, 2005 (KR) .................. 10-2005-0039718

(51) Int. Cl.
*H05K 1/11* (2006.01)
*H05K 1/14* (2006.01)

(52) U.S. Cl. .................. 361/803; 361/782; 361/784; 439/941

(58) Field of Classification Search ......... 361/782–785, 361/803; 439/59–60, 637
See application file for complete search history.

(56) References Cited

U.S. PATENT DOCUMENTS

| 5,692,910 | A | * | 12/1997 | Mittal .................. 439/59 |
| 5,704,489 | A | * | 1/1998 | Smith .................. 209/2 |
| 5,790,447 | A | * | 8/1998 | Laudon et al. .................. 365/52 |
| 5,995,405 | A |  | 11/1999 | Trick |
| 6,357,022 | B1 | * | 3/2002 | Nguyen et al. .................. 714/42 |
| 6,395,566 | B2 |  | 5/2002 | Farnworth |
| 6,421,250 | B1 |  | 7/2002 | Kim et al. |
| 6,625,687 | B1 |  | 9/2003 | Halbert et al. |

FOREIGN PATENT DOCUMENTS

| EP | 1 065 752 A1 | 1/2001 |
| JP | 2000-231784 | 8/2000 |
| JP | 2001-068181 | 3/2001 |
| KR | 2003-0088733 | 1/2003 |
| TW | 426993 | 3/2001 |

OTHER PUBLICATIONS

Preliminary Notice of the First Office Action from Taiwan Patent Office (TIPO) with an English Translation including the Search Report for corresponding Patent Application No. 095116501 ( 8 pages); Dated Jul. 24, 2008.
Notice to Submit Response corresponding to Korean Patent Application No. 10-2005-0039718 mailed Aug. 30, 2006.

* cited by examiner

*Primary Examiner*—Tuan T Dinh
(74) *Attorney, Agent, or Firm*—Myers Bigel Sibley & Sajovec, P.A.

(57) ABSTRACT

A memory module includes a body with a plurality of memory chips mounted thereon and an elongated connector protruding from the body. The elongated connector includes a plurality of single in-line memory module (SIMM)-type contacts at first portions along an edge thereof and a plurality of dual in-line memory module (DIMM)-type contacts at second portions along the edge thereof. The plurality of SIMM-type contacts may be positioned at opposing end portions of the elongated connector, and the plurality of DIMM-type contacts may be positioned between the opposing end portions. Related memory systems including a system board having a socket therein configured to receive the memory module are also discussed.

18 Claims, 7 Drawing Sheets

MEMORY MODULES INCLUDING SIMM AND DIMM-TYPE CONNECTION STRUCTURES AND RELATED MEMORY SYSTEMS

CROSS-REFERENCE TO RELATED APPLICATIONS

This application claims priority from Korean Patent Application No. 10-2005-0039718, filed on May 12, 2005, in the Korean Intellectual Property Office, the disclosure of which is hereby incorporated by reference herein in its entirety.

FIELD OF THE INVENTION

The present invention relates to computer systems, and more particularly, to memory modules for use in computer systems.

BACKGROUND OF THE INVENTION

Generally, computers may use various types of memory devices to store data. For example, in the past, some computers were manufactured by mounting memory devices directly on a main board. However, as recent trends have seen a reduction in the size of computers coupled with an increase in structural complexity, higher-speed, larger-capacity memory devices may be required. As such, it may be difficult to mount larger numbers of memory devices on the existing main board.

Figure 1A:
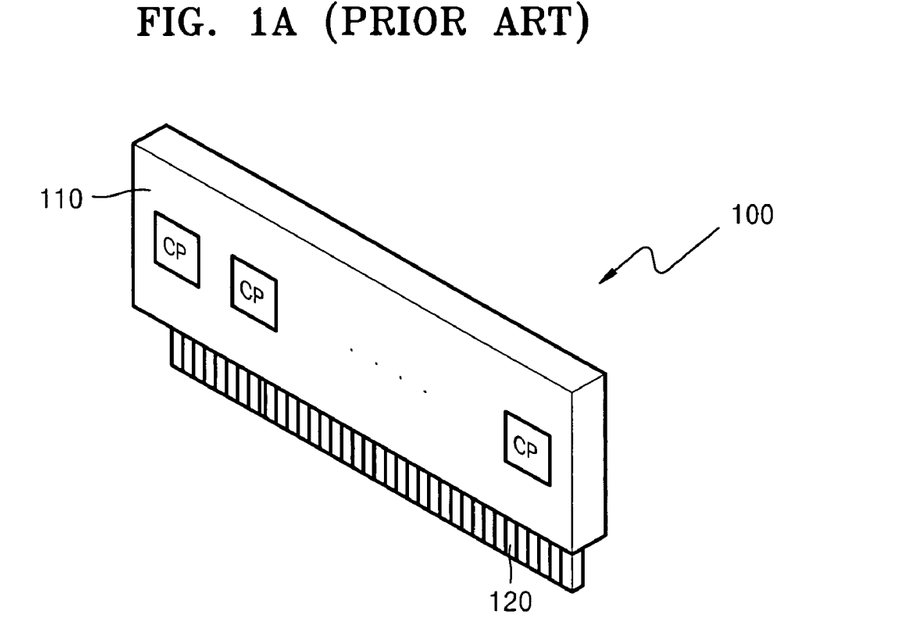
FIG. 1A is a perspective view of a conventional memory module.

Accordingly, memory modules on which a plurality of memory devices can be installed have been proposed. FIG. 1A illustrates the structure of a conventional memory module 100. The conventional memory module 100 includes a body 110 on which a plurality of memory chips CP are mounted, and a plurality of contacts 120 for signal transmission. The conventional memory module 100 may be a single in-line memory module (SIMM) or a dual in-line memory module (DIMM), according to the arrangement of the contacts 120.

In general, a SIMM may include 72 pins and may support transmission of 32-bit data, while a DIMM (which may be a two-folded SIMM) may include 168 pins and may support transmission of 64-bit data.

Figure 1B:
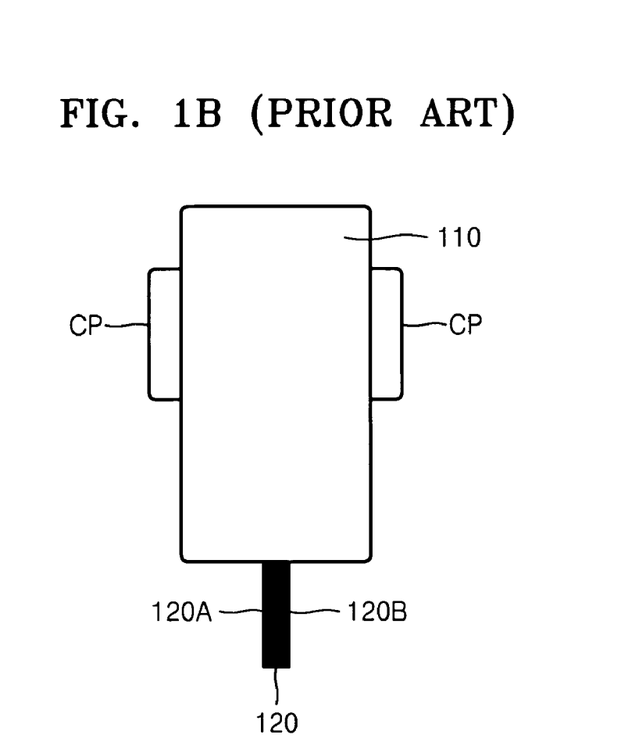
FIG. 1B is an end view of a conventional dual in-line memory module (DIMM) structure.

FIG. 1B illustrates the structure of a conventional DIMM. Referring now to FIG. 1B, a front portion 120A and a back portion 120B of each contact 120 of the DIMM are electrically separated from each other. Thus, signals input to the front portion 120A of each contact 120 can be input to a memory chip CP mounted on a body 110, and signals passing through the memory chips CP can be output via the back portion 120B of each contact 120.

Figure 2A:
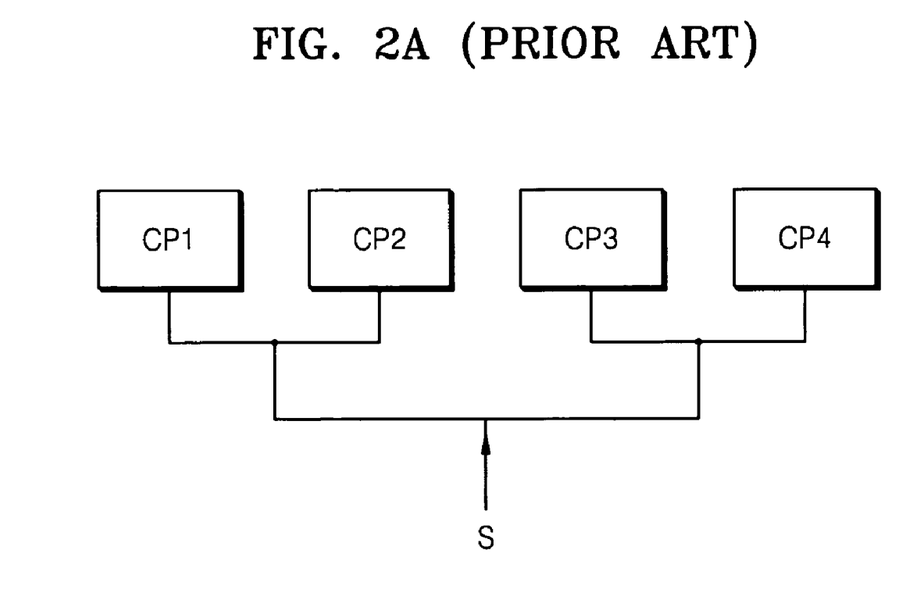
FIGS. 2A and 2B are schematic diagrams illustrating examples of conventional input signal flow for memory chips installed in a memory module.
Figure 2B:
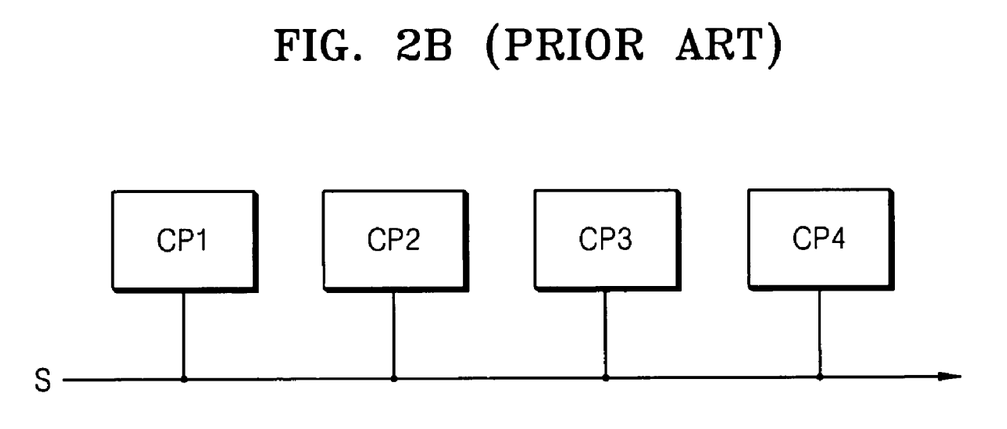

FIGS. 2A and 2B illustrate examples of the flow of input signals to memory chips CP1 through CP4 that may be mounted on a memory module. Referring to FIG. 2A, a signal S received via a contact of the memory module branches twice for distribution to the memory chips CP1 through CP4. In contrast, as shown in FIG. 2B, a signal S received via a contact of a memory module branches only once for distribution to memory chips CP1 through CP4.

Since the signal S may branch one or more times during transmission from the contact to the inputs of the memory chips CP1 through CP4, the signal S may be received by the chips CP1 through CP4 at different times, depending on the respective locations of the memory chips CP1 through CP4 on the memory module.

Figure 3A:
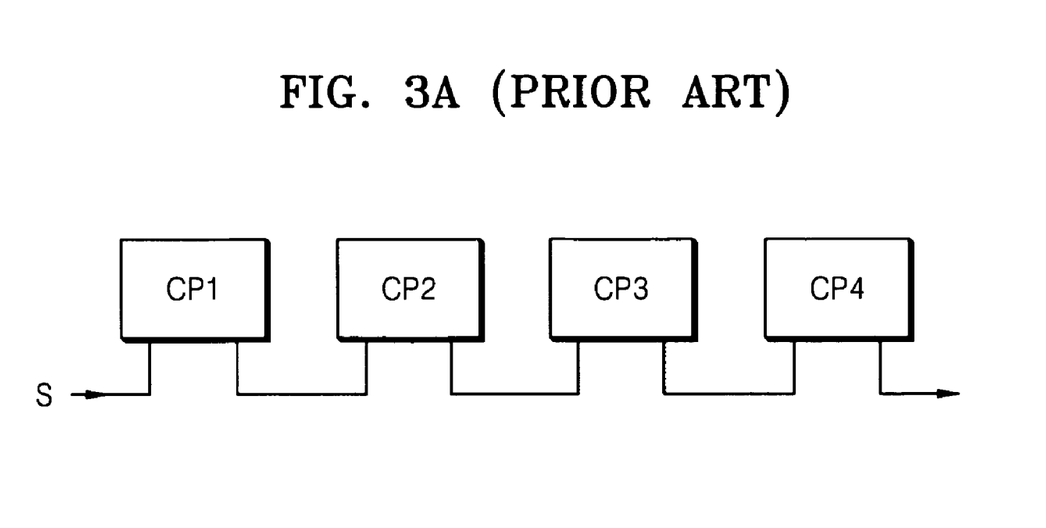
FIG. 3A is a schematic diagram illustrating a further example of conventional input signal flow for memory chips installed in a memory module.

FIG. 3A illustrates another example of the flow of a signal S to be input to first through fourth memory chips CP1 through CP4 that may be mounted on a memory module. Referring now to FIG. 3A, the signal S received via a contact (not shown) of the memory module is input to the first memory chip CP1, passes through the first memory chip CP1, and is input to the second memory chip CP2. Likewise, the signal S passes through the second memory chip CP2, and is sequentially input to the third and fourth memory chips CP3 and CP4. As shown in FIG. 3A, the manner in which the signal S is input is referred to as a "daisy chain" transmission scheme. The signal S may include serial data.

Figure 3B:
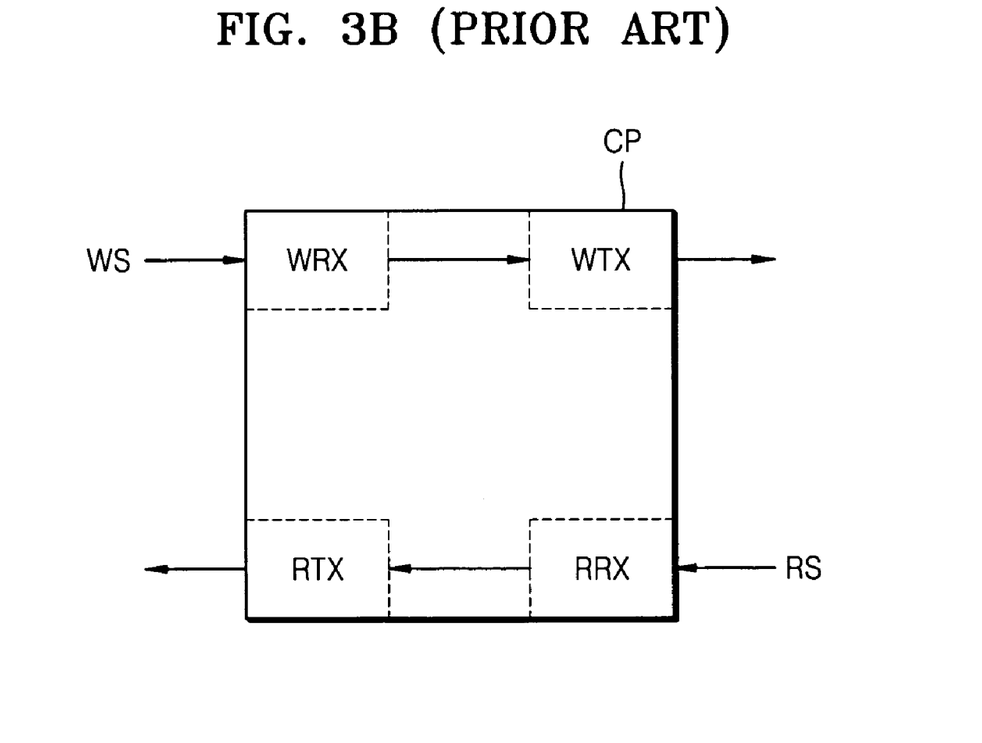
FIG. 3B is a schematic diagram illustrating the structure of the memory chips illustrated in FIG. 3A.

FIG. 3B illustrates the structure of a memory chip CP, which may correspond to one of the memory chips CP1 to CP4 as shown in FIG. 3A. For the daisy chain signal transmission scheme illustrated in FIG. 3A, the memory chip CP may be fabricated such that pins used for input and output of a write signal WS from the memory chip CP during a write operation may be different from the pins used for input and output of a read signal RS from the memory chip CP during a read operation. In other words, as shown in FIG. 3B, the write signal WS to be input to the memory chip CP during the write operation is input to a write signal receiving unit WRX of the memory chip CP, and is output via a write signal transmitting unit WTX. Similarly, the read signal RS to be input to the memory chip CP during the read operation is input to a read signal receiving unit RRX of the memory chip CP, and is output via the read signal transmitting unit RTX.

Figure 4:
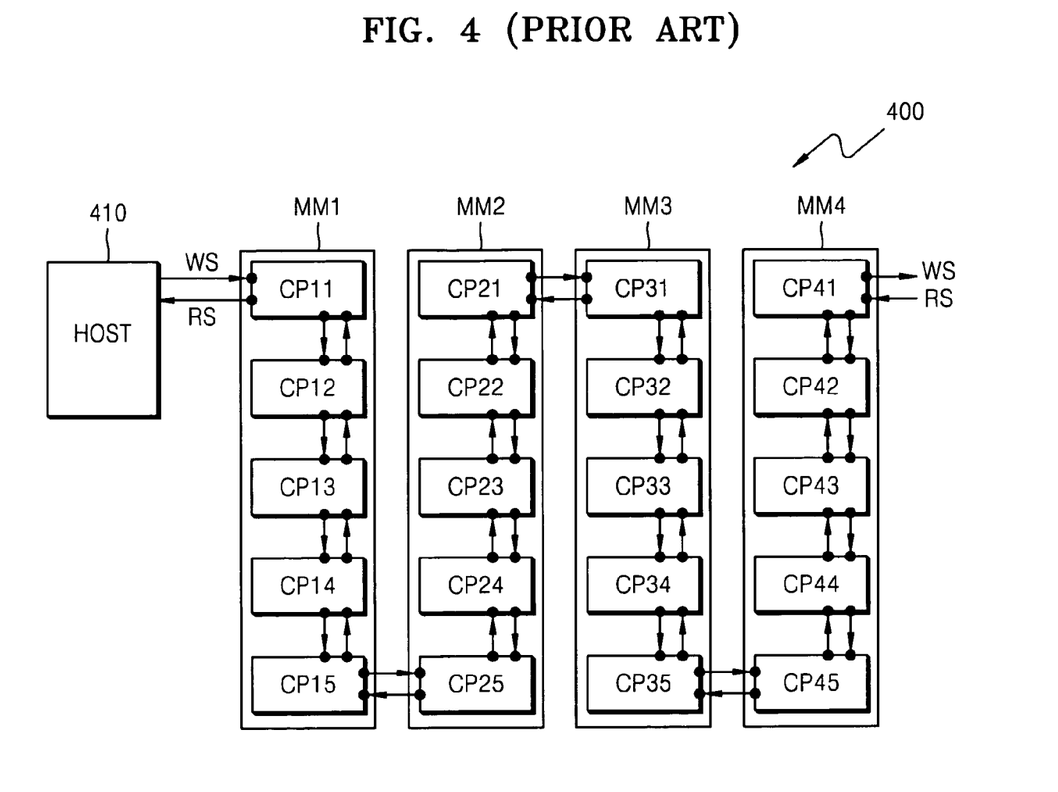
FIG. 4 is a block diagram of a conventional memory system including memory modules with a plurality of memory chips as illustrated in FIG. 3B.

FIG. 4 illustrates a memory system 400 including first through fourth memory modules MM1 through MM4 on which memory chips according to FIG. 3B are mounted. The memory system 400 includes the first through fourth memory modules MM1 through MM4, and a host 410. The host 410 may be a memory controller. During a write operation, a write signal WS output from the host 410 is input to a memory chip CP11 of the first memory module MM1. Then (as similarly illustrated in FIG. 3A), the write signal WS input to the memory chip CP11 is transmitted to memory chip CP12 adjacent to the memory chip CP11. Likewise, the write signal WS is serially transmitted through memory chips CP13, CP14, and C15, and is then output from the last memory chip CP15.

The write signal WS output from memory chip CP15 is input to a last memory chip CP25 of the second memory module MM2, is serially transmitted through memory chips CP24, CP23, CP22, and CP21, and is input to the third memory module MM3 via memory chip CP21. The write signal WS is similarly input to the fourth memory module MM4, and is input to a next memory module (not shown) via a first memory chip CP41 of the fourth memory module MM4.

In contrast, during a read operation, a read signal RS is first input to the first memory chip CP41 of the fourth memory module MM4. Then (as similarly illustrated in FIG. 3A), the read signal RS is output from the memory chip CP41, serially transmitted to adjacent memory chips CP42, CP43, CP44, CP45, and finally output from the last memory chip CP45 of the fourth memory module MM4.

The output read signal RS is input to a last memory chip CP35 of the third memory module MM3, serially transmitted through memory chips CP34, CP33, CP32, and CP31, and input to the second memory module MM2 via the first memory chip CP31. Similarly, the read signal RS is serially transmitted through memory modules MM2 and MM1, and finally input to the host 410 via the first memory chip CP11 of the first memory module MM1.

Accordingly, FIG. 4 illustrates the layout of a memory module including memory chips in which the pins used for input and/or output of a write signal WS during a write operation are different from the pins used for input and/or output of a read signal RS during a read operation. As shown in FIG. 4, the configuration of the first memory module MM1 is the same as that of the third memory module MM3, and the configuration of the second memory module MM2 is the same as that of the fourth memory module MM4. However, because the pins used for input and/or output in the first and third memory modules MM1 and MM3 are different from those of the second and fourth memory modules MM2 and MM4, the configurations of the first and third memory modules MM1 and MM3 are different from those of the second and fourth memory modules MM2 and MM4.

As such, when a memory system is constructed using memory modules with memory chips such as those illustrated in FIG. 3B, two or more types of memory modules having different configurations and/or structures may be required.

SUMMARY OF THE INVENTION

Some embodiments of the present invention provide memory modules having both single in-line memory module (SIMM) and dual in-line memory module (DIMM) structures, as well as memory systems configured to accept such memory modules.

According to some embodiments of the present invention, a memory module may include single in-line memory module (SIMM)-type contacts mounted at both ends of the memory module and dual in-line memory module (DIMM)-type contacts mounted at a center of the memory module.

According to other embodiments of the present invention, a memory module may include a body having a first edge and formed of an insulating material, and a plurality of contacts mounted along the first edge. Contacts attached to first parts of the first edge may be different from contacts attached to a second part of the first edge. For example, the contacts attached to the first parts may be single in-line memory module type contacts, and the contacts attached to the second part may be dual in-line memory module type contacts. The first parts may correspond to both ends of the first edge, and the second part may correspond to the remaining part of the first edge.

In some embodiments, the contacts attached to the first parts may be divided into contacts via which a signal input to the memory module is transmitted, and contacts via which a signal output from the memory module is transmitted. The signal input or output via the contacts attached to the first parts may be a serial communication signal including addresses, commands, and data.

In other embodiments, the memory module may further include a plurality of memory chips mounted on the body. In each memory chip, pins via which a signal is input or output during a write operation may be different from pins via which a signal is input or output during a read operation. The memory chips may transmit or receive a signal in a daisy chain manner.

In some embodiments, the body may include a first edge on which a plurality of memory chips are mounted, a plurality of first contacts mounted at both ends of the body, and a plurality of second contacts mounted at the remaining part of the first edge. Some of the second contacts may face a front surface of the body, and the rest of the second contacts may face a back surface of the body. Each of the first contacts may include a first part facing the front surface of the body and a second part facing the back surface of the body. The second contacts facing the front surface of the body may be electrically separated from the second contacts facing the back surface of the body, while the first parts of the first contacts facing the front surface may be electrically connected to the second parts of the first contacts facing the back surface.

In other embodiments, in each of the memory chips, pins via which a signal is input or output during a write operation may be different from pins via which a signal is input or output during a read operation. Also, a signal input via the first contacts attached to one end of the first edge may be input to a predetermined first memory chip, transmitted to a last memory chip in a daisy chain manner, and then output via the first contacts attached to the other end of the first edge.

According to still other embodiments of the present invention, a memory system may include a plurality of memory modules, a plurality of memory chips mounted on each of the memory modules, and a system board having sockets which are respectively electrically connected to the memory modules. Each of the memory modules may include a body having a first edge with the memory chips mounted on the body, a plurality of first contacts mounted on both ends of the first edge, and a plurality of second contacts mounted on the remaining part of the first edge.

According to further embodiments of the present invention, a memory module may include a body with a plurality of memory chips mounted thereon and an elongated connector protruding from the body. The elongated connector may include a plurality of single in-line memory module (SIMM)-type contacts at first portions along an edge thereof, and a plurality of dual in-line memory module (DIMM)-type contacts at second portions along the edge thereof. For example, the plurality of SIMM-type contacts may be positioned at opposing end portions of the elongated connector, and the plurality of DIMM-type contacts may be positioned between the opposing end portions.

In some embodiments, the plurality of SIMM-type contacts may include first contacts at outer portions of the opposing end portions of the connector, and second contacts at the opposing end portions of the connector between the first contacts. The first contacts may be configured to conduct a first signal therebetween; and the second contacts may be configured to conduct a second signal therebetween. In addition, the first and second contacts may each include an input signal contact at one of the opposing end portions of the connector, and an output signal contact at the other of the opposing end portions of the connector.

According to other embodiments of the present invention, a memory module may include a body configured to hold a plurality of memory chips thereon and an elongated connector protruding from the body. The memory module may further include a first plurality of contacts having first portions along an edge of the elongated connector on a first side thereof, and second portions along the edge of the connector on the second side thereof that are electrically connected to the first portions. In addition, the memory module may include a second plurality of contacts having first portions along the edge of the elongated connector on the first side thereof, and second portions along the edge of the connector on the second side thereof that are electrically isolated from the first portions.

According to still further embodiments of the present invention, a memory system may include a memory module and a system board. The memory module may include a body portion having a plurality of memory chips thereon and a connector portion protruding therefrom. The connector portion may include a plurality of single in-line memory module (SIMM)-type contacts along first portions of an edge thereof and a plurality of dual in-line memory module (DIMM)-type contacts along second portions of the edge thereof. The system board may include a socket therein that may be configured to receive the memory module. The socket may include a SIMM-type socket structure at first portions thereof and a DIMM-type socket structure at second portions thereof respectively corresponding to the first and second portions of the edge of the memory module connector portion.

In some embodiments, the memory system may further include a second memory module including a body portion having a second plurality of memory chips thereon and a connector portion protruding therefrom including a plurality of SIMM-type contacts and a plurality of DIMM-type contacts. The plurality of SIMM-type contacts and the plurality of DIMM-type contacts of the second memory module may be identical in configuration to those of the first memory module. In addition, the system board may include a second socket therein adjacent to the first socket and configured to receive the second memory module. As such, the first and second memory modules may be respectively mounted in the first and second sockets of the system board such that a first end of the first memory module is adjacent to a second end of the second memory module opposite a first end thereof, and a second end of the first memory module is adjacent to the first end of the second memory module.

DETAILED DESCRIPTION OF EMBODIMENTS OF THE INVENTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first end of a memory module could be termed a second end, and, similarly, a second end could be termed a first end without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Figure 5A:
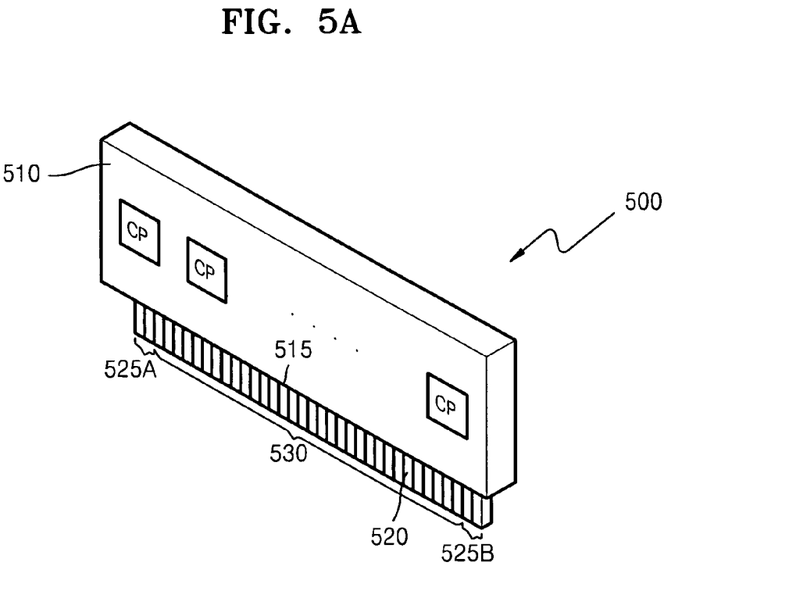
FIG. 5A is a perspective view of a memory module according to some embodiments of the present invention.
Figure 5B:
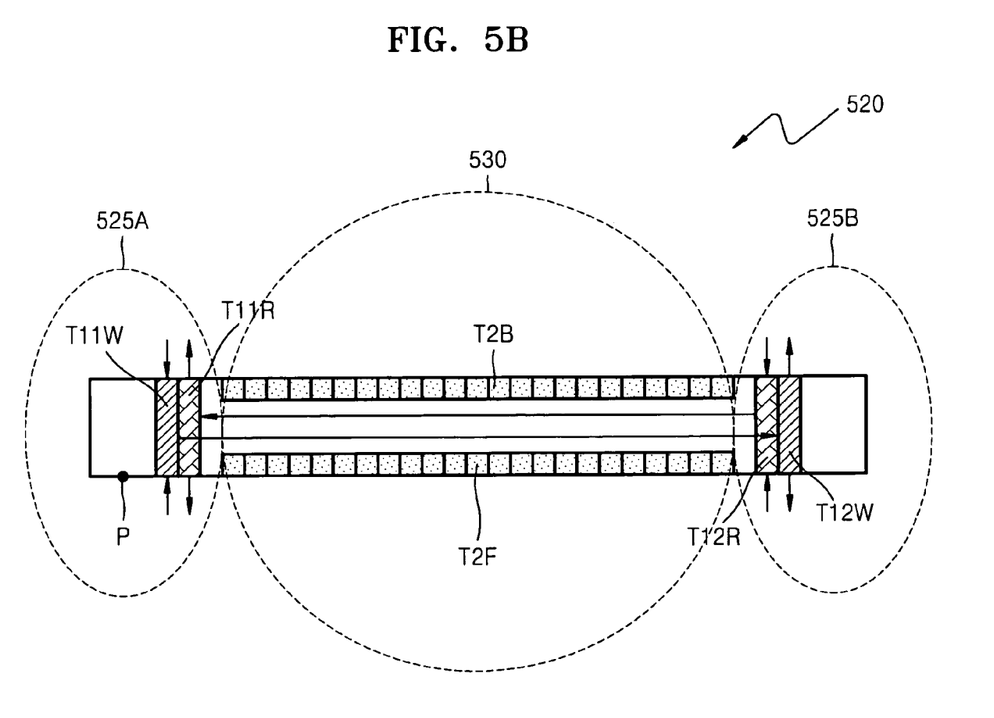
FIG. 5B is a bottom view of a contact structure of the memory module of FIG. 5A according to some embodiments of the present invention.

Referring now to the drawings, FIG. 5A illustrates a memory module 500 according to some embodiments of the present invention. FIG. 5B illustrates a contact structure of the memory module 500.

Referring to FIG. 5A, single in-line memory module (SIMM)-type contacts are attached to opposite ends of a connector portion 515 of the memory module 500, and dual in-line memory module (DIMM)-type contacts are attached at the center of the memory module 500 between the SIMM-type contacts. More specifically, the memory module 500 includes a body 510 that has a connector/edge 515 protruding therefrom. The body 510 may be formed of an electrically insulating material. A plurality of contacts 520 are installed along the connector 515. The type of contacts attached to first portions 525A and 525B of the connector 515 and the type of contacts attached to a second portion 530 of the connector 515 are different.

More particularly, as shown in FIG. 5A, the contacts attached to the first portions 525A and 525B are SIMM-type contacts, and the contacts attached to the second portion 530 are DIMM-type contacts. The first portions 525A and 525B denote opposite ends of the connector 515, and the second portion 530 denotes the intermediate portion of the connector 515 between the opposing end portions.

Since the contacts attached to the first portions 525A and 525B are SIMM-type contacts, the portions of the contacts facing a front side of the body 510 are electrically connected to the portions of the contacts facing a back side of the body 510. In contrast, the contacts attached to the second portion 530 are DIMM-type contacts. As such, contacts T2F attached to the front side of the body 510 are electrically separated from contacts T2B attached to the back side. FIG. 5B illustrates the contact structure in greater detail. The number of the SIMM-type contacts attached to the first portions 525A and 525B of the connector 515 and the number of the DIMM-type contacts attached to the second portion 530 are not limited. In other words, greater or fewer SIMM-type and/or DIMM-type contacts may be provided on the connector 515 in some embodiments of the present invention.

Referring now to FIG. 5B, the SIMM-type contacts attached to the first portions 525A and 525B include contacts T11W and T12R that receive signals to be input to the memory module 500 of FIG. 5A, as well as contacts T11R and T12W that transmit signals to be output from the memory module 500. As such, during a write operation, even if write signals are input and output from the memory chips on different pins than those used for input and output of read signals during a read operation, it may be possible to lessen and/or eliminate the need for two different types of memory modules (as illustrated in FIG. 4). More specifically, the memory module 500 having a contact structure according to some embodiments of the present invention may allow for write and/or read signals to be routed between a plurality of memory modules of a single type, as will be further described below with reference to FIG. 6.

A signal to be input or output via the contacts attached to the first portions 525A and 525B may include serial address, command, and/or data communication signals. That is, addresses, commands, and data may be transmitted serially, and may be input to or output from the memory module 500 via the contacts attached to the first portions 525A and 525B of the connector 515. The contacts T2F and T2B attached to the second portion 530 of the connector 515 may be configured to receive a power signal and/or other control signals according to some embodiments of the present invention.

Figure 6:
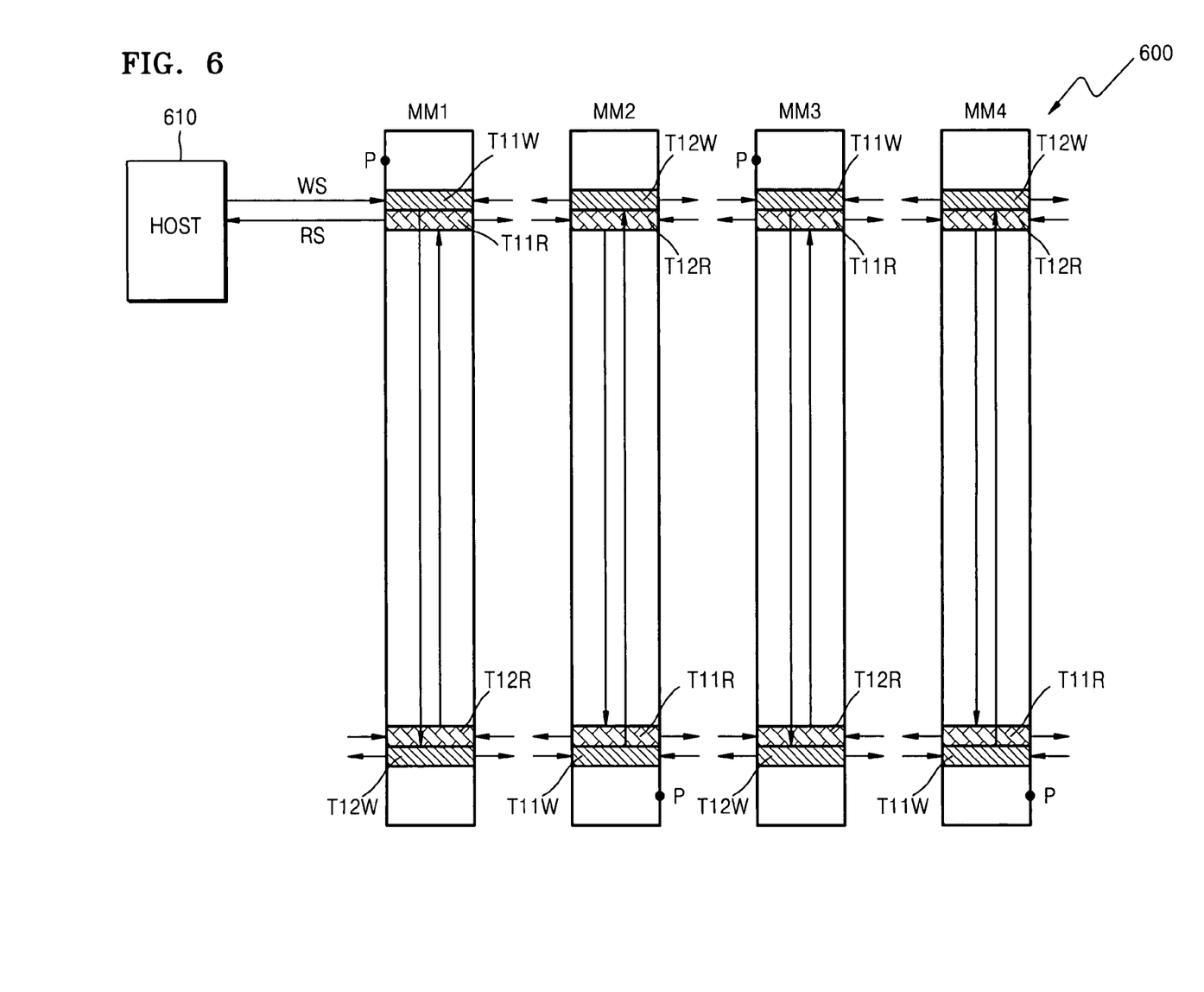
FIG. 6 is a bottom view of a memory system with memory modules including the contact structure of FIG. 5B according to some embodiments of the present invention.

FIG. 6 illustrates a memory system 600 including four memory modules having the contact structure illustrated in FIG. 5B according to some embodiments of the present invention. Referring now to FIG. 6, in a write operation, a write signal WS output from a host 610 is input to a contact T11W at one end of a first memory module MM1, and is transmitted to memory chips (not shown) of the first memory module MM1. The transmission of the write signal WS to the memory chips may be performed as illustrated in FIG. 3A.

The write signal WS output from a last memory chip of the first memory module MM1 is input to a contact T11W of the second memory module MM2 via a contact T12W at the opposite end of the first memory module MM1. Similarly, the write signal WS input to the second memory module MM2 sequentially passes through memory chips (not shown) of the second memory module MM2, and is input to the third memory module MM3 via a contact T12W of the second memory module MM2. The write signal WS is input to the third memory module MM3 and to the fourth memory module MM4 via their respective contacts T11W, and output via their respective contacts T12W. Likewise, during a read operation, a read signal RS is input to the first through fourth memory modules MM1 through MM4 via their respective contacts T12R, and is output via their respective contacts T11R.

As shown in FIG. 6, all of the first through fourth memory modules MM1 through MM4 have the same configuration. More particularly, the second memory module MM2 may be mounted on a system board (not shown) such that a first/top end thereof is adjacent to a second/bottom end of the first memory module MM1. For convenience, a reference point of the first memory module MM1 to which the write signal WS is input from the host 610 is indicated by node P at the first/top end thereof. The relative positions of the first memory module MM1 and the second memory module MM2 are arranged with reference to the node P at the first/top end portions of each of the first and second memory modules MM1 and MM2, so that the first/top end of the second memory module MM2 is adjacent to the second/bottom end of the first memory module MM1.

Accordingly, the memory system 600 can be fabricated without the use of two different types and/or configurations of memory modules. In contrast, in the memory system 400 of FIG. 4, the configurations of the first and third memory modules MM1 and MM3 are different from that of the second and fourth memory modules MM2 and MM4.

Figure 7:
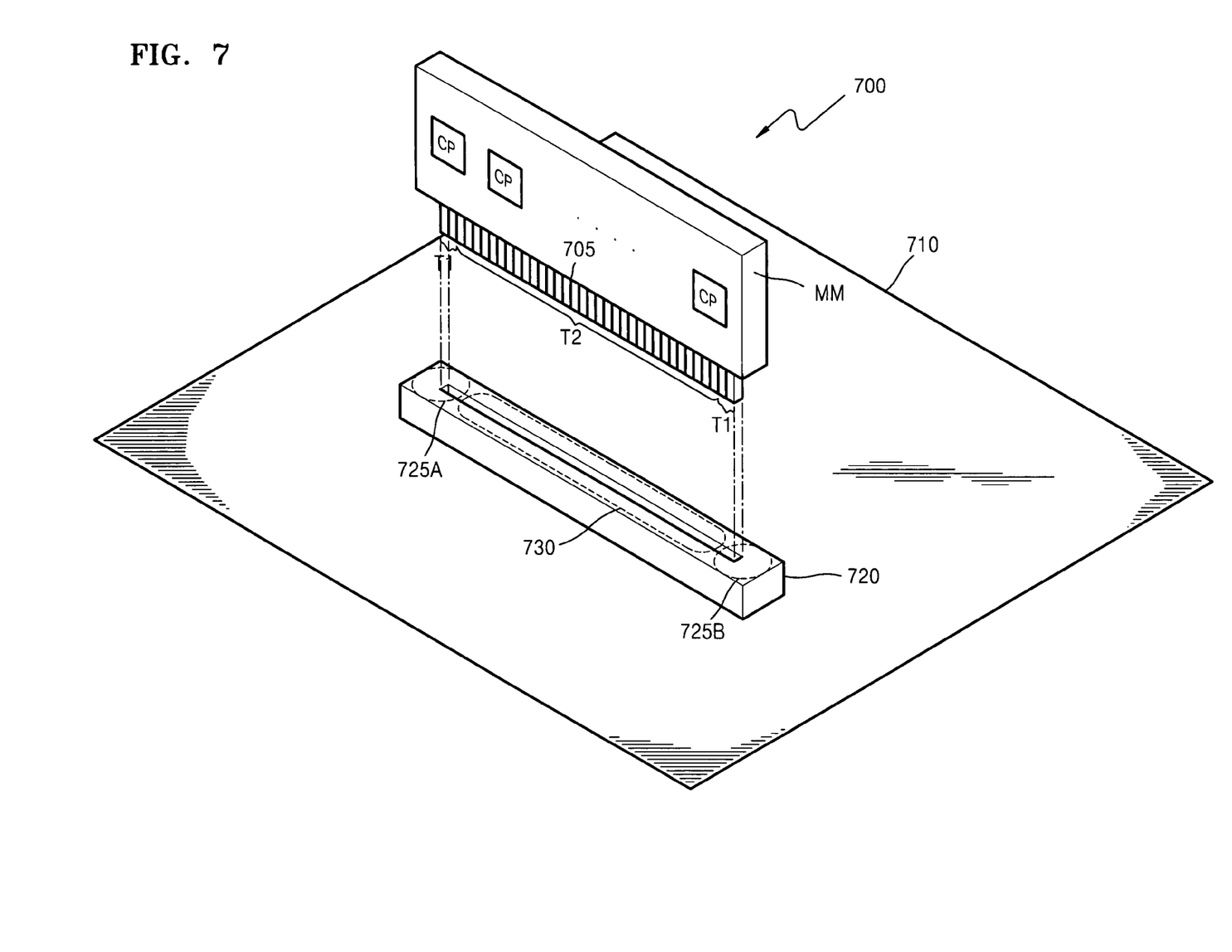
FIG. 7 is a perspective view of a memory system including a socket corresponding to the memory module of FIG. 5A according to some embodiments of the present invention.

FIG. 7 illustrates a memory system 700 including a socket configured to accept the memory module 500 of FIG. 5A according to some embodiments of the present invention. The memory system 700 includes a system board 710, a socket 720 mounted on the system board 710, and a memory module MM to be connected to the socket 720. FIG. 7 illustrates only one memory module MM and socket 720 for convenience; however, a greater number of memory modules and/or sockets may be provided.

As shown in FIG. 7, the memory module MM has the same configuration as the memory module 500. That is, contacts T1 at opposite ends of a connector/edge 705 are SIMM-type contacts, and contacts T2 on the remaining part of the connector 705 are DIMM-type contacts.

In the socket 720, portions 725A and 725B at the opposite ends of the socket 720 have a SIMM-type socket structure configured to provide electrical connections with the contacts T1 at opposite ends of the memory module MM. The remaining portions 730 of the socket 720 have a DIMM-type socket structure configured to provide electrical connections with the contacts T2 at the middle portion of the memory module MM between the contacts T1.

Accordingly, even if a plurality of memory modules MM are provided respectively including a plurality of memory chips CP is as illustrated in FIG. 3B, (i.e., a plurality of memory chips where write signals and read signals are input/output from different pins), it may be possible to manufacture a memory system using only a single type of memory module. A plurality of sockets may be configured to accept the plurality of memory modules MM as described above.

Thus, according to some embodiments of the present invention, it may be possible to manufacture a memory system using a single type of memory module even when the memory chip pins to which a write signal is input and/or output during a write operation are different from the memory chip pins to which a read signal is input and/or output during a read operation. As such, manufacturing costs may be reduced.

While the present invention has been particularly shown and described with reference to exemplary embodiments thereof, it will be understood by those skilled in the art that various changes in form and details may be made therein without departing from the spirit and scope of the invention, as defined by the appended claims.

That which is claimed:

1. A memory module, comprising:
   a body with a plurality of memory chips mounted thereon; and
   an elongated connector protruding from the body,
   wherein the elongated connector comprises a plurality of single in-line memory module (SIMM)-type contacts at first portions along an edge thereof and a plurality of dual in-line memory module (DIMM)-type contacts at second portions along the edge thereof, wherein the plurality of SIMM-type contacts are positioned at opposing end portions of the elongated connector, and wherein the plurality of DIMM-type contacts are positioned between the opposing end portions, and wherein the elongated connector comprises a first side and a second side opposite the first side, wherein the plurality of SIMM-type contacts comprise first portions along the edge of the connector on the first side and second portions along the edge of the connector on the second side that are electrically connected to the first portions, and wherein the plurality of DIMM-type contacts comprise first portions along the edge of the connector on the first side and second portions along the edge of the connector on the second side that are electrically isolated from the first portions.

2. The memory module of claim 1, wherein the plurality of SIMM-type contacts comprise:

first contacts at outer portions of the opposing end portions of the connector and configured to conduct a first signal therebetween; and second contacts at the opposing end portions of the connector between the first contacts and configured to conduct a second signal therebetween.

3. A memory system including the memory module of claim 1, the memory system further comprising:

a system board including a socket therein that is configured to receive the memory module, the socket comprising a SIMM-type socket structure at first portions thereof and a DIMM-type socket structure at second portions thereof respectively corresponding to the first and second portions of the edge of the memory module connector.

4. The memory module of claim 2, wherein the first and second contacts each include an input signal contact at one of the opposing end portions of the connector and an output signal contact at the other of the opposing end portions of the connector.

5. The memory module of claim 2, wherein the first contacts are configured to conduct a write signal therebetween, and wherein the second contacts are configured to conduct a read signal therebetween.

6. The memory module of claim 2, wherein the first and/or second contacts are respectively configured to conduct serial communication signals therebetween.

7. The memory module of claim 2, wherein ones of the first and second contacts are electrically connected to first and last ones of the plurality of memory chips, and wherein the first and second contacts are respectively configured to conduct the first and second signals serially between the plurality of memory chips.

8. The memory system of claim 3, wherein the plurality of SIMM-type contacts comprise:

first contacts at outer portions of the opposing end portions of the connector and configured to conduct a first signal therebetween; and second contacts at the opposing end portions of the connector between the first contacts and configured to conduct a second signal therebetween.

9. The memory system of claim 8, wherein the first and second contacts each include an input signal contact at one of the opposing end portions of the connector and an output signal contact at the other of the opposing end portions of the connector.

10. The memory system of claim 9, wherein the memory module comprises a first memory module having a first plurality of memory chips thereon, the memory system further comprising:

a second memory module including a body portion having a second plurality of memory chips thereon and a connector portion protruding therefrom including a plurality of SIMM-type contacts along opposing end portions of an edge thereof and a plurality of DIMM-type contacts along the edge thereof between the plurality of SIMM-type contacts, wherein the system board further comprises a second socket therein adjacent to the first socket and configured to receive the second memory module, the second socket comprising a SIMM-type socket structure at opposing end portions thereof and a DIMM-type socket structure positioned between the SIMM-type socket structures.

11. The memory system of claim 10, wherein the plurality of SIMM-type contacts and the plurality of DJMM-type contacts of the second memory module are identical in configuration to those of the first memory module.

12. The memory system of claim 11, wherein the first and second memory modules are respectively mounted in the first and second sockets of the system board such that a first end of the first memory module is adjacent to a second end of the second memory module opposite a first end thereof and a second end of the first memory module is adjacent to the first end of the second memory module.

13. The memory system of claim 12, further comprising:

a third memory module including a body portion having a third plurality of memory chips thereon and a connector portion protruding therefrom including a plurality of SIMM-type contacts and a plurality of DIMM-type contacts that are identical in configuration to those of the second memory module, wherein the system board further comprises a third socket therein configured to receive the third memory module adjacent to the second socket, the third socket comprising a SIMM-type socket structure at opposing end portions thereof and a DJMM-type socket structure positioned between the SIMM-type socket structures.

14. The memory system of claim 13, wherein the third memory module is mounted in the third socket of the system board such that a first end of the third memory module is adjacent to the second end of the second memory module and a second end of the third memory module is adjacent to the first end of the second memory module.

15. The memory system of claim 14, wherein the first contacts of the plurality of SIMM-type contacts of the first memory module comprise a write signal input contact configured to receive a write signal at the first end of the first memory module and a write signal output contact configured to transmit the write signal at the second end thereof opposite the first end.

16. The memory system of claim 15, wherein the second contacts of the plurality of SIMM-type contacts of the first memory module comprise a read signal input contact configured to receive a read signal at the second end of the first memory module and a read signal output contact configured to transmit the read signal at the first end thereof.

17. The memory system of claim 16, wherein ones of the first and second contacts of the first memory module are electrically connected to first and last ones of the first plurality of memory chips, and wherein the first and second contacts are respectively configured to conduct the write signal and the read signal serially between the first plurality of memory chips.

18. A memory module including a body configured to hold a plurality of memory chips thereon and an elongated connector protruding from the body, the memory module comprising:
- first contacts comprising first portions along an edge of the elongated connector on a first side thereof and second portions along the edge of the connector on a second side thereof that are electrically connected to the first portions; and
- second type contacts comprising first portions along the edge of the elongated connector on the first side thereof and second portions along the edge of the connector on the second side thereof that are electrically isolated from the first portions,
- wherein the first type contacts comprise single in-line memory module (SIMM)-type contacts, wherein the second type contacts comprise dual in-line memory module (DIMM)-type contacts,
- wherein the SIMM-type contacts are positioned at opposing end portions of the elongated connector, and wherein the DIMM-type contacts are positioned between the opposing end portions.

* * * * *